(12) United States Patent
Lin et al.

(10) Patent No.: US 12,276,923 B2
(45) Date of Patent: Apr. 15, 2025

(54) EXHAUST SYSTEM WITH U-SHAPED PIPES

(71) Applicant: Taiwan Semiconductor Manufacturing Co., Ltd., Hsin-Chu (TW)

(72) Inventors: Yu-Fu Lin, Hsinchu (TW); Shih-Chang Shih, Tainan (TW); Chia-Chen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/673,669

(22) Filed: May 24, 2024

(65) Prior Publication Data

US 2024/0310741 A1 Sep. 19, 2024

Related U.S. Application Data

(63) Continuation of application No. 18/337,574, filed on Jun. 20, 2023, now Pat. No. 11,994,809, which is a
(Continued)

(51) Int. Cl.
*G03F 7/00* (2006.01)
*B01D 53/04* (2006.01)
(Continued)

(52) U.S. Cl.
CPC ..... *G03F 7/70858* (2013.01); *B01D 53/0407* (2013.01); *B01D 53/30* (2013.01);
(Continued)

(58) Field of Classification Search
CPC . G03F 7/70858; B01D 53/0407; B01D 53/30; B01D 2257/108; B01D 2257/533;
(Continued)

(56) References Cited

U.S. PATENT DOCUMENTS 5,637,153 A 6/1997 Niino et al.
9,013,673 B2 4/2015 Gosen et al.
(Continued)

FOREIGN PATENT DOCUMENTS

| CN | 101165207 B | 4/2008 |
|---|---|---|
| TW | 200527491 A | 8/2005 |
| TW | M527792 | 9/2016 |

*Primary Examiner* — Avinash A Savani
*Assistant Examiner* — Dana K Tighe
(74) *Attorney, Agent, or Firm* — HAYNES AND BOONE, LLP (57) ABSTRACT

An exhaust system for discharging from semiconductor manufacturing equipment a hazardous gas includes: a main exhaust pipe above the semiconductor manufacturing equipment and having a top surface on a first side and a bottom surface on a second side, a first branch pipe connected to a source of a gas mixture containing the hazardous gas on the second side and connected to the main exhaust pipe through the top surface, a second branch pipe connected to a gas box on the second side and connected to the main exhaust pipe through the bottom surface, and a detector on the second branch pipe configured to detect presence of the hazardous gas and downstream to the gas box. The first and the second branch pipes are connected to the main exhaust pipe at a first location and a second location, respectively. The first location is more upstream than the second location.

20 Claims, 6 Drawing Sheets

Related U.S. Application Data continuation of application No. 17/233,203, filed on Apr. 16, 2021, now Pat. No. 11,681,232, which is a continuation of application No. 15/704,549, filed on Sep. 14, 2017, now Pat. No. 10,983,447.

(51) Int. Cl.
*B01D 53/30* (2006.01)
*C23C 16/44* (2006.01)

(52) U.S. Cl.
CPC .... *C23C 16/4412* (2013.01); *B01D 2257/108* (2013.01); *B01D 2257/553* (2013.01); *B01D 2257/93* (2013.01); *B01D 2258/0216* (2013.01)

(58) Field of Classification Search
CPC ........ B01D 2257/93; B01D 2258/0216; C23C 16/4412
USPC .......................................................... 454/49
See application file for complete search history.

(56) References Cited

U.S. PATENT DOCUMENTS

| | | |
|---|---|---|
| 2001/0044161 A1 | 11/2001 | Komiyama |
| 2008/0047581 A1 | 2/2008 | Miyazaki |
| 2015/0368794 A1 | 12/2015 | Morita et al. |

EXHAUST SYSTEM WITH U-SHAPED PIPES

PRIORITY DATA

The present application is a continuation application of U.S. patent application Ser. No. 18/337,574, filed on Jun. 20, 2023, entitled "Exhaust System with U-Shaped Pipes," which is a continuation application of U.S. patent application Ser. No. 17/233,203, filed on Apr. 16, 2021, entitled "Exhaust System with U-Shaped Pipes," and issued as U.S. Pat. No. 11,681,232, which is a continuation of U.S. patent application Ser. No. 15/704,549, filed on Sep. 14, 2017, entitled "Exhaust System with U-Shaped Pipes," and issued as U.S. Pat. No. 10,983,447, each of which is hereby incorporated by reference in its entirety.

BACKGROUND

Integrated circuit fabrication tools and their supporting utilities use different gases or mixtures thereof for a variety of purposes and generate a myriad of gas species through chemical reactions taking place in the fabrication processes. All these gas species from the integrated circuit fabrication tools or utilities are reused, recycled, or discharged. Some gas species are toxic or hazardous and require precautionary measures to ensure safety and appropriate release into the atmosphere. A commonly seen practice is to enclose valves, actuators, safety release devices, and piping for a toxic/hazardous gas in an enclosure or a gas box. That way, in case of leakage of any of the enclosed devices, the toxic/hazardous gas would not be released into the atmosphere, contaminate the clean room, and in a worst case, permeate into areas occupied by workers. The enclosures, sometimes referred to as gas boxes, include a discharge pipe connected to a general exhaust pipe, also known as a main exhaust pipe. That way, any toxic/hazardous gas leaked into a gas box would not accumulate in the gas box or leak into the surrounding area.

To detect leakage into a gas box, a detector is installed in the discharge pipe connected to the general exhaust pipe. If leakage into the gas box is detected by the detector, an alarm would sound. Depending on the type of the toxic/hazardous gas, the warning signal may trigger a variety of procedures, including emergency shutdown and evacuation of the fab work floor. Although such procedures are disruptive and costly, they are necessary to prevent injury, death, and large monetary damages.

Some toxic/hazardous gases can be released directly into the atmosphere if they are sufficiently diluted by harmless gases in gas mixtures. Consequently, such gas mixtures can be released into the general exhaust pipe for direct discharge. However, sometimes the toxic/hazardous gas in the safe-to-release gas mixture can escape into a discharge pipe connected to a gas box, triggering the detector and causing unnecessary shutdown.

While the existing exhaust systems are adequate for general purposes, they are not satisfactory in all aspects. Thus, an exhaust system that can prevent false triggering of the detectors in a discharge pipe may be desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor manufacturing facilities, often called fabs, employ a wide array of gases, including many hazardous and/or toxic gases, such as arsine, phosphine, silane, diborane, hydrogen, hydrogen chloride, and nitrous oxide. These exemplary gases are hazardous and/or toxic for different reasons. Arsine, phosphine, and diborane are toxic and hazardous for being flammable and pyrophoric. Silane is pyrophoric. Hydrogen is hazardous for being flammable and asphyxiant. Hydrogen chloride is toxic and hazardous for being corrosive. Nitrous oxide is hazardous for being a strong oxidizer. Whenever these hazardous/toxic gases are stored, distributed, used, or discharged in semiconductor manufacturing processes, there are possible hazards such as fire, explosion, contamination, unscheduled shutdown, product loss, and in worst situations, injury and death of personnel.

To ensure safety and to come in compliance with the applicable regulations, gas monitoring is necessary. For added safety, containers, actuators, piping, valves, safety release devices, and sometimes process tools that carry or use hazardous/toxic gases are often isolated from the surrounding environment by secondary enclosures or gas boxes. As hazardous/toxic gases are to be contained in the enclosures, monitoring of hazardous/toxic gases present in the enclosures becomes important. Gas boxes are ventilated through discharge pipes into the main exhaust pipe to prevent buildup of any leaked hazardous/toxic gas. Even though hazardous/toxic gases are contained and ventilated, any leak has to be detected and addressed. Modern-day gas sensors can detect gases in the low ppm range and are usually installed within gas boxes or discharge pipes to continuously sample gases moving through them. Oftentimes when a leak is detected, an alarm will sound to notify personnel to carry out necessary procedures such as evacuation, a tool shutdown, a shutoff of gas cylinders, and an emergency maintenance. All such procedures result in disruption of the manufacturing lines and scrapping of affected unfinished products. Checking a system for leak and starting a manufacturing line back up can be time-consuming.

Hazardous and/or toxic gases cannot be discharged directly into the atmosphere. They have to be treated by a burner or a wet scrubber to be converted into forms appropriate for discharge. In some instances, certain toxic and/or hazardous gases can be discharged in a gas mixture if their concentration in the gas mixture is diluted below a threshold where they are no longer toxic or hazardous. For example, while hydrogen is highly flammable over wide range of concentrations in air, it has a lower flammability limit of 4.0% by volume. That is, if hydrogen is present in a gas mixture at 4.0% by volume or lower, the gas mixture can be discharged into the atmosphere, provided the other gas(es) in the gas mixture is (are) not otherwise hazardous or toxic and the practice is lawful in the jurisdiction where the fab is located.

When various exhaust gases flow in a main exhaust pipe, relatively lighter gases tend to flow in the top portion of the main exhaust pipe and relatively heavier gases tend to flow in the bottom portion of the main exhaust pipe. Hydrogen and helium are the lightest two gases on earth. Hydrogen therefore rises rapidly in air and tends to flow in the topmost portion of the main exhaust pipe. In fact, even though the main exhaust pipe in a fab is subject to a pressure differential to drive the exhaust gas out, hydrogen still can move upward into any space adjacent to the topmost portion of the main exhaust pipe. In some instances, trace hydrogen in the main exhaust pipe can find its way into a discharge pipe connected to a gas box and trigger hydrogen detectors, causing an alarm to false sound. In those situations, an evacuation and a manufacturing line shutdown are wasteful and unnecessary.

Light gases such as hydrogen is used and generated in semiconductor manufacturing processes. For example, chemical vapor deposition (CVD) of silicon oxide with the use of silane generates hydrogen. For another example, an extreme ultraviolet (EUV) lithography system requires hydrogen as a buffer gas to fill the EUV generation chamber where plasma of a target material such as xenon, lithium or tin is radiated with laser. As described above, because hydrogen is a hazardous gas, the CVD and EUV process tools and any piping, valve, and safety release devices are enclosed in one or more gas boxes for containment. Each of these gas boxes ventilates through a discharge pipe connected to the main exhaust pipe.

Silicon oxide is one of the most common dielectric materials used in semiconductor devices. Silicon oxide can be used as a pre-metal dielectric layer, an insulation layer, and a gap filler. One of the ways to form silicon oxide features is CVD. Depending on the application, sometimes a varied form of CVD can be used to deposit silicon oxide. For example, plasma-enhanced CVD (PECVD) and high density plasma CVD (HDP-CVD) can be used to enhance the gap filling ability of the resulting silicon oxide layer. In any of these various forms, a silicon-containing reactive gas and an oxygen-containing reactive gas are supplied into a CVD chamber. In cases where silane is used as the silicon-containing reactive gas, hydrogen would be a by-product. Sometimes a hydrogen-containing reactive gas, such as phosphine and diborane, is also supplied to the CVD chamber and the resulting silicon oxide film would include boron or phosphorous, as the case may be. In some instances, the CVD chamber is cleaned by a plasma containing argon.

As the functional density of integrated circuit (i.e., the number of interconnected devices per chip area) increases, the critical dimension (i.e., the smallest component (or line) that can be created using a fabrication process) decreases. This scaling down process generally provides benefits by increasing production efficiency and lowering associated costs. To advance the scaling down process, the need to perform lithography processes at high resolutions grows. One lithography technique is EUV lithography. EUV lithography employs scanners using light in the EUV region, having a wavelength about 1-100 nm. An EUV lithography system requires an EUV radiation source. In an EUV generation chamber, a droplet generator draws pressure from a propellant gas, such as an inert gas or a mixture containing an inert gas, to produce minute droplet of target materials such as tin and lithium. The generation of target droplet is synchronized with a pulse laser, such as a pulse $CO_2$ laser to emit laser beams through an output window integrated with a collector of EUV radiation. The EUV generation is usually done in a hydrogen gas ambient to protect the collector from contamination of tin or lithium particles.

A gas mixture, sometimes referred to as forming gas, is used to propel molten target material, such as molten tin or lithium, out of a droplet generator. In some instances, the forming gas includes about 2% of hydrogen and about 98% of argon. Because the forming gas exiting the EUV chamber has a hydrogen volume percentage lower than the lower flammability limit, it can be directly released into the main exhaust pipe for discharge into the atmosphere. The forming gas entering and exiting the EUV chamber therefore maintains a hydrogen volume concentration at about 2%. Sometimes trace hydrogen from the forming gas in the main exhaust pipe could back flow into the discharge pipe connected to the main exhaust pipe from the top surface. When that happens, the gas detector installed in the gas box or its discharge pipe is triggered and an alarm would falsely sound.

Figure 1:
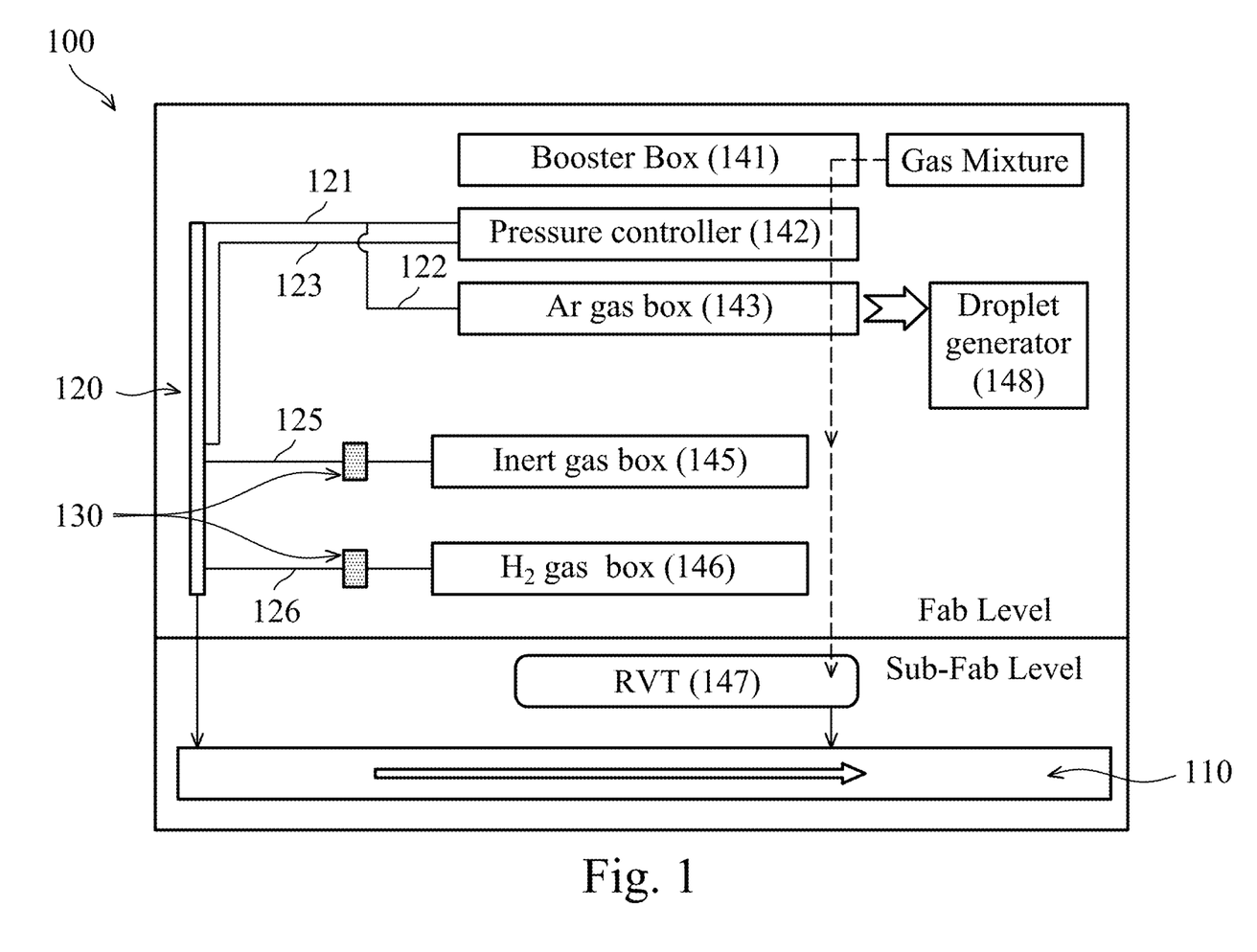
FIG. 1 is a schematic view of an exhaust system having a main exhaust pipe positioned below the fab.

Shown in FIG. 1 is a schematic view of an exhaust system 100 having a main exhaust pipe 110 positioned below semiconductor manufacturing tools on the fab level. For illustration purposes, semiconductor tools here are part of an EUV lithography system. A booster box 141 receives a gas mixture containing a hazardous gas and pressurizes the gas mixture through pumping. In the example of an EUV lithography system, the gas mixture is forming gas containing about 2% of hydrogen and about 98% of argon. As hydrogen and argon are of molecular weights of 2 and 39.95, respectively, the average molecular weight is about 39.2, which is higher than the air's 28.6. A pressure controller 142 takes feed of pressurized forming gas from the booster box 141 and modulates the pressure of the forming gas it feeds to an argon gas box 143. The forming gas coming out of the argon gas box 143 is fed to a droplet generator 148 as propellant gas for droplet generation. As target droplets are expelled into the EUV generation chamber (sometimes referred to as the source plasma vessel, not shown in FIG. 1), forming gas also enters into the EUV generation chamber. In some instances, forming gas exiting the EUV generation chamber contain hydrogen at more than 4% by volume and cannot be released directly into the main exhaust pipe 110. In some operations when the forming gas is not fed to the droplet generator 148, forming gas is temporarily redirected to a discharge pipe 121 coming out of the pressure controller 142 or a discharge pipe 122 coming out of the argon gas box 143 for release into a branch pipe 120. The branch pipe 120 is connected to the main exhaust pipe 110. In other words, the pressure controller 142 and the argon box 143 ventilate through discharge pipes 122 and 123 into a branch pipe 120. Because the booster box 141, the pressure controller 142 and the argon box 143 do not contain gases at hazardous concentrations, discharge pipes 121, 122, and 123 are not fitted with gas detectors. Sometimes the pressurized forming gas from the booster box 141, the pressure controller 142, and the argon box 143 is ventilated directly into the main exhaust pipe 110 after first being depressurized in a rapid vent tank (RVT) 147 as illustrated in FIG. 1 (the path shown in dotted lines). It is noted that as each of the gas boxes is a secondary containment here, any connection to a gas box refers to a connection to a component enclosed in that gas box. In addition, for purposes of an exhaust system, sometimes the booster box 141, the pressure controller 142, and the gas box 143 can be considered a gas source of forming gas.

An inert gas box 145 encloses tools, piping and valves for receiving mixture of argon and hydrogen from argon flowing over the surface of EUV optical components to prevent contamination from tin or lithium particles. The inert gas box 145 is ventilated through a discharge pipe 125 into the branch pipe 120. A hydrogen box 146 is an enclosure for tools, piping and valves for supplying hydrogen into the EUV generation chamber. The hydrogen box 146 is ventilated through a discharge pipe 126 into the branch pipe 120. In some instances, because the inert gas box 145 and the hydrogen box 146 are secondary containment for hydrogen of 4% by volume or higher, their discharge pipes 125 and 126 are fitted with hydrogen detectors 130. In some other instances, the hydrogen detectors 130 are installed within the inert gas box 145 and the hydrogen box 146.

Because all the discharge pipes 121, 122, 123, 125, and 126 are all connected to the branch pipe 120, sometimes trace hydrogen in the forming gas from the discharge pipe 121 can back flow into discharge pipes 125, and 126 and be detected by the hydrogen detectors 130, causing an alarm to falsely sound.

Figure 2:
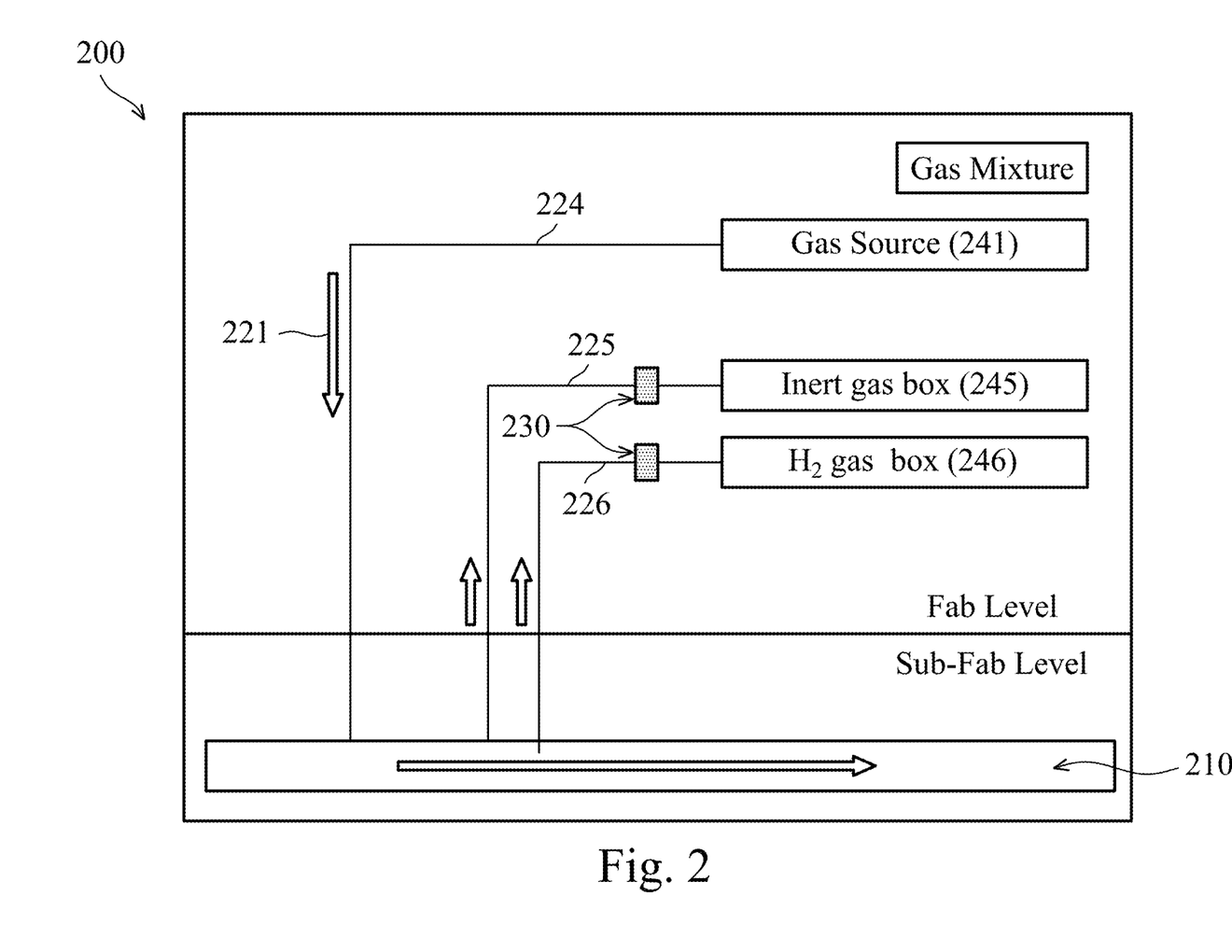
FIG. 2 is a schematic view of another exhaust system having a main exhaust pipe positioned below the fab.

FIG. 2 is a schematic view of an exhaust system 200 having a main exhaust pipe 210 positioned below semiconductor manufacturing tools on the fab level. A gas source 241 carries a forming gas containing about 2% of hydrogen and 98% of argon and ventilates through a discharge pipe 221 into the main exhaust pipe 210. In some instances, the gas source 241 stands for a plurality of gas boxes. For example, the gas source 241 may include a booster box, a pressure controller, and a high pressure argon gas box. An inert gas box 245 and a hydrogen gas box 246 enclose tools, piping, and valves carrying hydrogen at a volume concentration of 4% or higher. The inert gas box 245 and the hydrogen gas box 246 ventilate through discharge pipes 225 and 226 into the main exhaust pipe 210. Because the inert gas box 245 and the hydrogen gas box 246 are secondary containment for hydrogen of hazardous concentrations, discharge pipes 225 and 226 are fitted with hydrogen detectors 230. In some instances, hydrogen detectors 230 are installed within the inert gas box 245, and the hydrogen gas box 246.

All discharge pipes 221, 225, and 226 are connected to the main exhaust pipe 210. As hydrogen is the lightest gas, it quickly floats to the top and tends to flow in the top portion of the main exhaust pipe. Because the discharge pipes 225 and 226 are all connected to the main exhaust pipe through its top surface, sometimes trace hydrogen in the forming gas from the discharge pipe 221 can float and permeate into discharge pipes 225 and 226 and be detected by the hydrogen sensors 230, causing an alarm to falsely sound.

Figure 3:
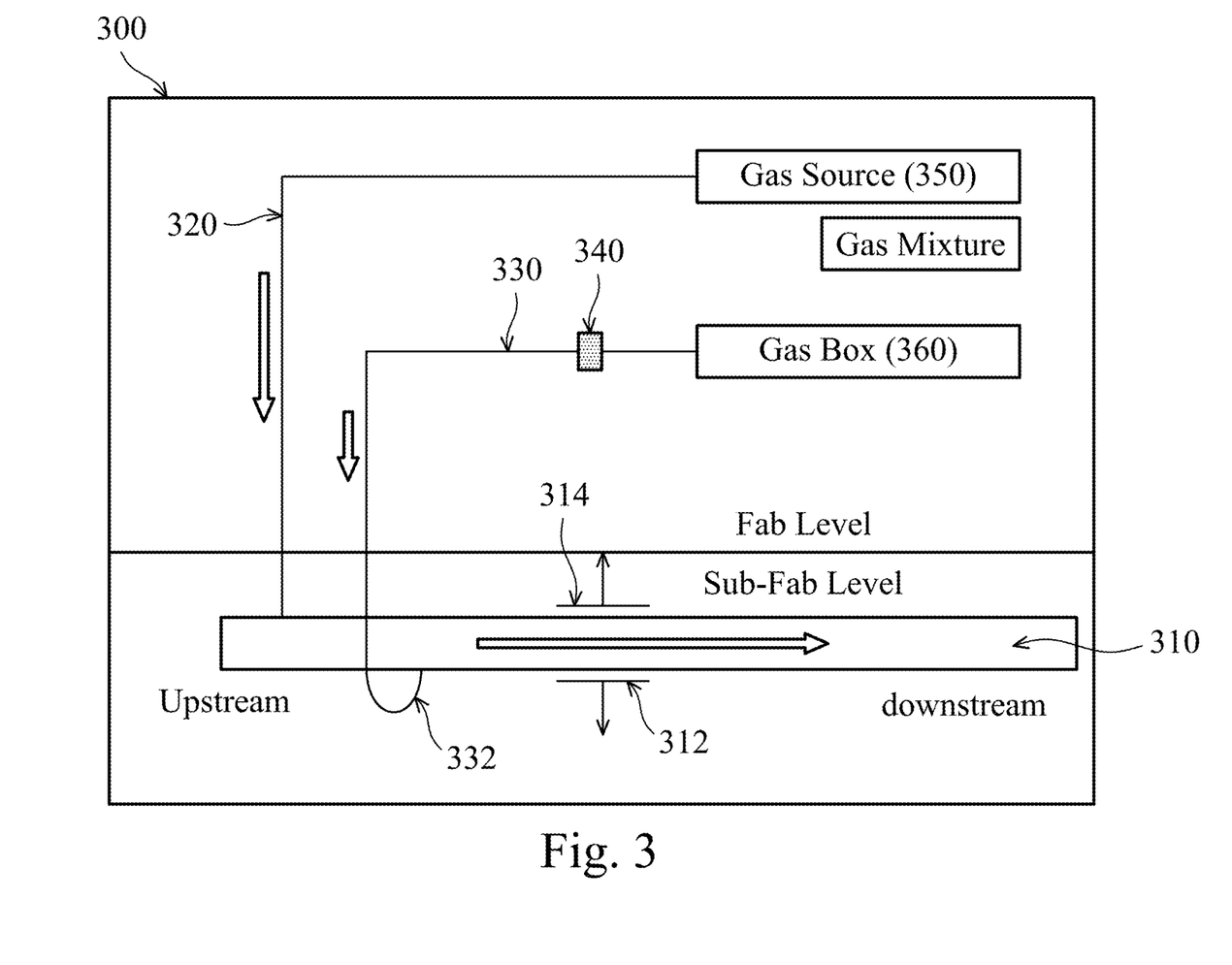
FIG. 3 is a schematic view of an exhaust system having a main exhaust pipe positioned below the fab, in accordance with aspects of the present disclosure.

Shown in FIG. 3 is a simplified schematic view of an exhaust system 300, according to aspects of the present disclosure. The exhaust system 300 includes a main exhaust pipe 310 below the semiconductor manufacturing tools positioned on the fab level. In some embodiments, a gas source 350 is a source of a gas mixture containing a light hazardous and/or toxic gas diluted down by an inert gas. In some instances, the light hazardous and/or toxic gas is less dense than air. In some embodiments, the gas source 350 is a source of a gas mixture containing less than 4% by volume of hydrogen and more than 96% of an inert gas. In some instances, the gas source 350 is a source of a gas mixture containing about 2% by volume of hydrogen and about 98% by volume of argon. Through a discharge pipe 320, the gas source 350 ventilates into a main exhaust pipe 310. A gas box 360 enclose piping, valves, tools, actuators, and safety release valves carrying a hazardous gas in its pure form or in a mixture at a concentration where the hazardous gas remains hazardous. In some instances, the hazardous gas is less dense than air. In some examples, the hazardous gas is hydrogen. The gas box 360 ventilates through a discharge pipe 330 into the main exhaust pipe 310. A detector 340 is installed in the discharge pipe 330 to monitor the gas moving through the discharge pipe 330. In instances where the hazardous gas is hydrogen, the detector 340 is configured to detect presence of hydrogen at low ppm levels. During regular operations, no hydrogen is flowing out of the gas box 360 and the detector 340 should not be triggered. However, if there is a leak in the gas box 360, the detector 340 should detect the minute amount of leaked hydrogen and sound an alarm. Emergency procedures such as evacuation and shutdown are usually expected in this situation.

In some embodiments, the discharge pipe 330 connects to the main exhaust pipe 310 through a bottom surface 312, rather than a top surface 314. Because hydrogen is the lightest gas and tends to flow in the topmost portion of the main exhaust pipe 310, hydrogen does not back flow into the discharge pipe 330 if it is connected through the bottom surface 312. In some instances, the discharge pipe 330 includes a U-shaped portion 332. The U-shaped portion 332 allows the discharge pipe 330 coming from above to literally enter a U-turn to connect to the main exhaust pipe 310 through the bottom surface 312. If the discharge pipe 330 connects to the main exhaust pipe 310 through the top surface 314, hydrogen from the gas mixture carried by the discharge pipe 320 into the main exhaust pipe may find its way upward into the discharge pipe 330 and falsely triggers the alarm, causing unnecessary and costly shutdown and evacuation. Such a false alarm tends to take place especially when the discharge pipe 320 connects to the main exhaust pipe 310 at a location more upstream than the location where the discharge pipe 330 connects to the main exhaust pipe 310.

Figure 4:
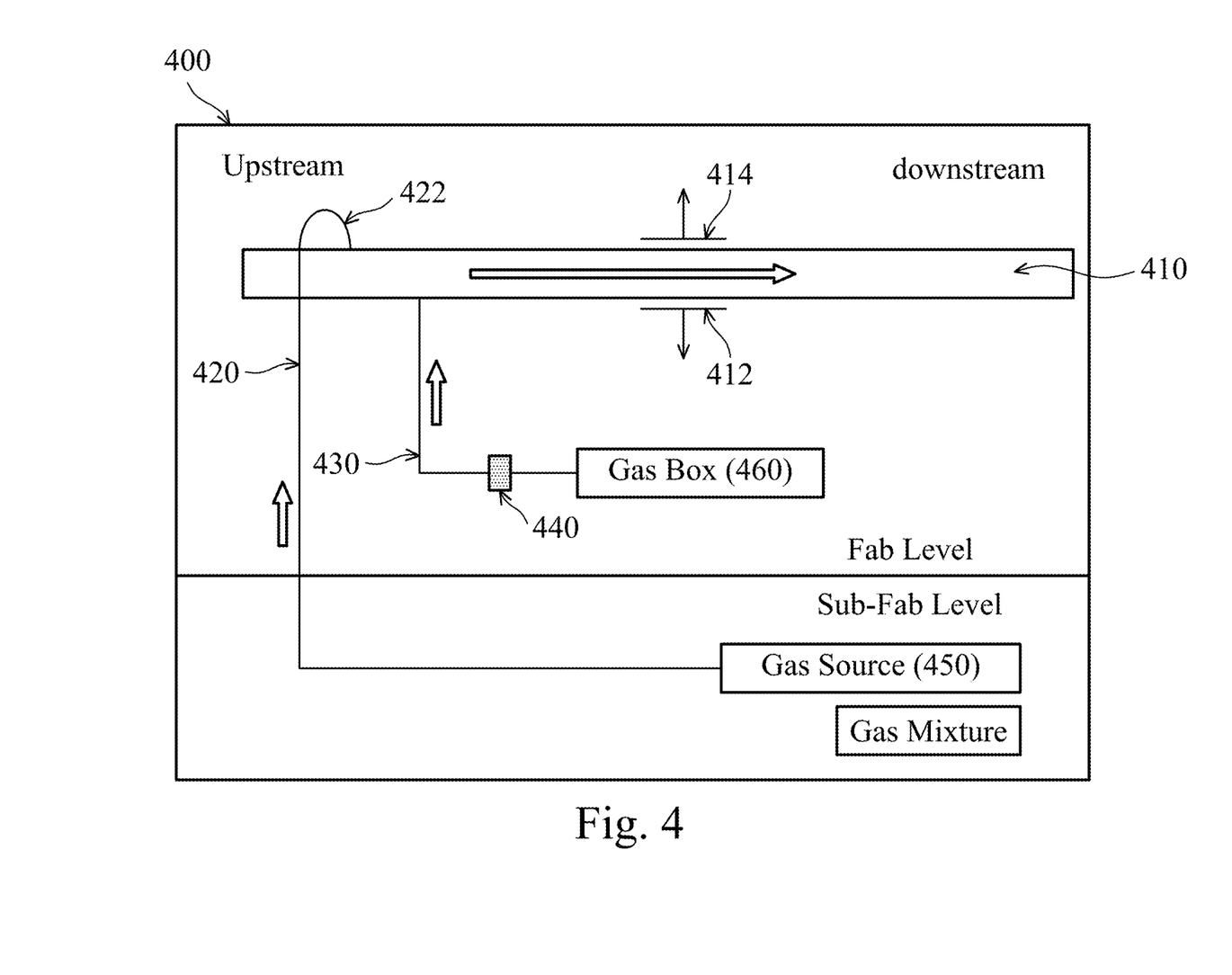
FIG. 4 is a schematic view of an exhaust system having a main exhaust pipe positioned above the fab, in accordance with aspects of the present disclosure.

Depending on the design of the fab, sometimes a main exhaust pipe is located above the fab level where the semiconductor manufacturing tools are located. FIG. 4 is a schematic view of an exhaust system 400 having a main exhaust pipe 410 positioned above the fab, in accordance with aspects of the present disclosure. In some embodiments, a gas source 450 is a source of a gas mixture containing a light hazardous and/or toxic gas diluted down by an inert gas. In some instances, the light hazardous and/or toxic gas is less dense than air. In some embodiments, the gas source 450 is a source of a gas mixture containing less than 4% by volume of hydrogen and more than 96% of an inert gas. In some instances, the gas source 450 is a source of a gas mixture containing about 2% by volume of hydrogen and about 98% by volume of argon. Through a discharge pipe 420, the gas source 450 ventilates into a main exhaust pipe 410. A gas box 460 enclose piping, valves, tools, actuators, and safety release valves carrying a hazardous gas in its pure form or in a mixture at a concentration where the hazardous gas remains hazardous. In some instances, the hazardous gas is less dense than air. In some examples, the hazardous gas is hydrogen. The gas box 360 ventilates through a discharge pipe 330 into the main exhaust pipe 310. A detector 340 is installed in the discharge pipe 330 to monitor the gas moving through the discharge pipe 330. In instances where the hazardous gas is hydrogen, the detector 340 is configured to detect presence of hydrogen at low ppm levels. During regular operations, no hydrogen is flowing out of the gas box 460 and the detector 440 should not be triggered. However, if there is a leak in the gas box 460, the detector 440 should detect the minute amount of leaked hydrogen and sound an alarm. Emergency procedures such as evacuation and shutdown are usually expected in this situation.

In some embodiments, the discharge pipe 420 connects to the main exhaust pipe 410 through a top surface 414, rather than a bottom surface 412. In some instances, the gas mixture from the gas source 450 contains about 2% of hydrogen and about 98% of argon, the gas mixture is denser than air. Having the denser-than-air gas mixture coming through the top surface 414 promotes mixing of gases in the main exhaust pipe 410. The discharge pipe 430, however, connects to the main exhaust pipe 410 through the bottom surface 412. Because hydrogen is the lightest gas and tends to flow in the topmost portion of the main exhaust pipe 410, hydrogen does not back flow into the discharge pipe 430 if it is connected through the bottom surface 412. In some instances, the discharge pipe 420 includes a U-shaped portion 422. The U-shaped portion 422 allows the discharge pipe 420 coming from below to literally enter a U-turn to connect to the main exhaust pipe 410 through the top surface 412. If the discharge pipe 430 connects to the main exhaust pipe 410 through the top surface 414, hydrogen from the gas mixture carried by the discharge pipe 420 into the main exhaust pipe may find its way upward into the discharge pipe 430 and falsely triggers the alarm, causing unnecessary and costly shutdown and evacuation. Such a false alarm tends to take place especially when the discharge pipe 420 connects to the main exhaust pipe 410 at a location more upstream than the location where the discharge pipe 430 connects to the main exhaust pipe 410.

Figure 5:
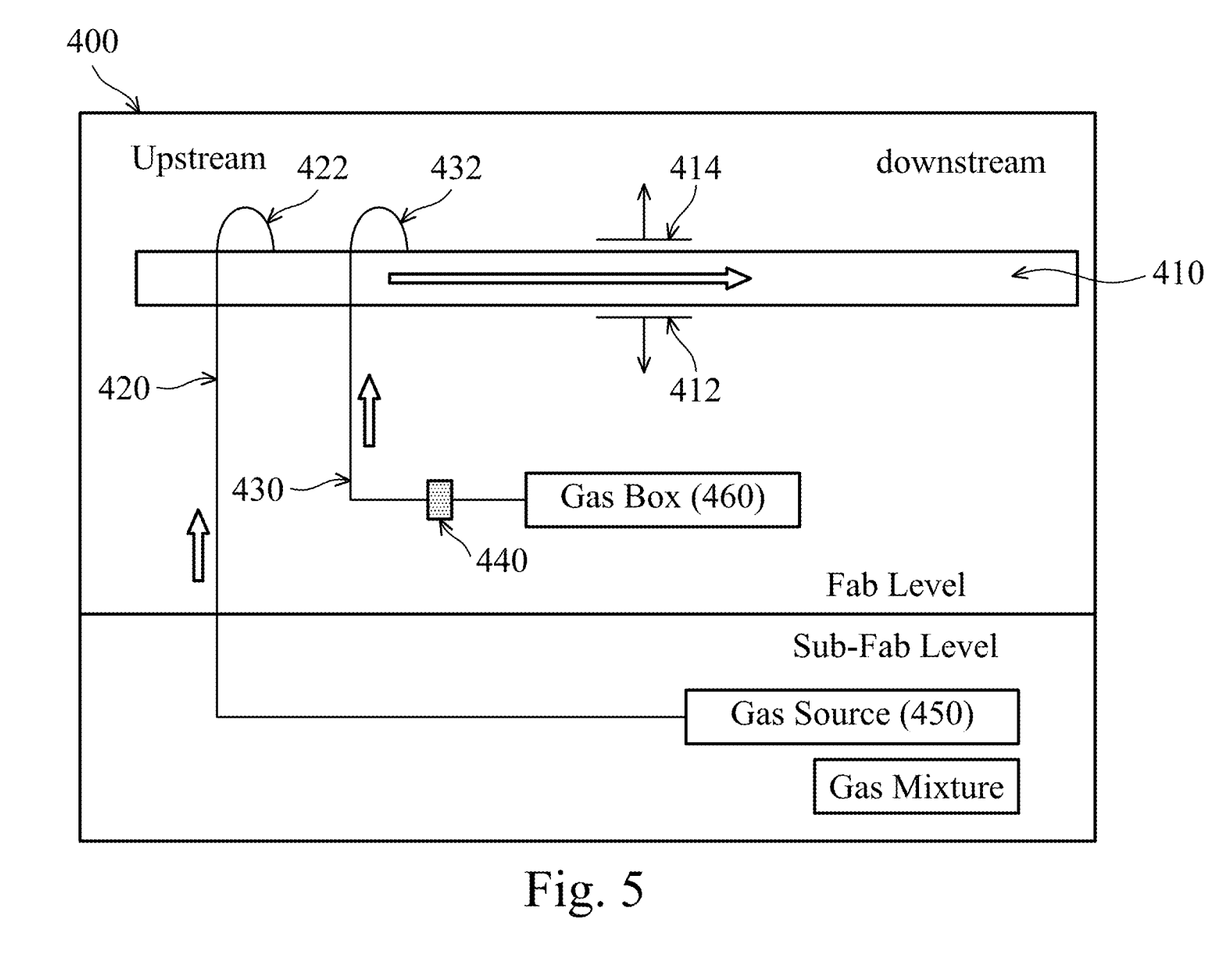
FIG. 5 is a schematic view of an exhaust system having a main exhaust pipe positioned above the fab, in accordance with aspects of the present disclosure.

While several examples are described with respect to a lighter-than-air hazardous/toxic gas such as hydrogen, aspects of the present disclosure are applicable to a denser-than-air hazardous/toxic gas. Taking the exhaust system 400 in FIG. 4 for example, if the hazardous gas is denser than air, it tends to sink to the bottom of the main exhaust pipe 410. In embodiments where the discharge pipe 430 connects to the main exhaust pipe 410 through the bottom surface 412. The denser-than-air hazardous/toxic gas from the gas mixture flowing past the connection to the main exhaust pipe 410 may find its way into the discharge pipe 430 and falsely trigger the alarm. To prevent the false alarm, the discharge pipe 430 is made to connect to the main exhaust pipe 410 through its top surface 414 via a U-shaped portion 432, as shown in FIG. 5, rather than through the bottom surface 412.

Figure 6:
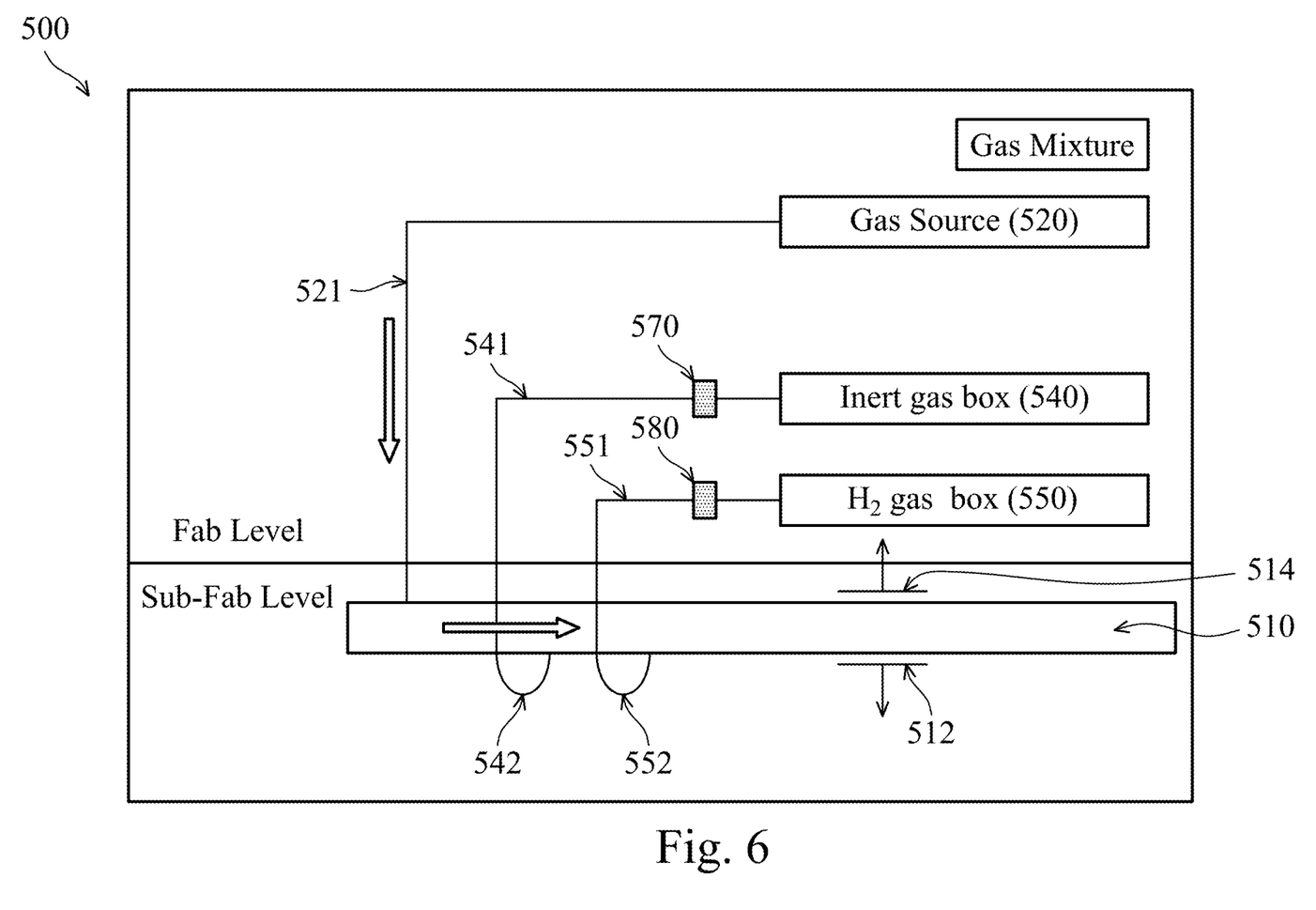
FIG. 6 is a schematic view of an exhaust system having a plurality of branch pipes, according to aspects of the present disclosure.

Shown in FIG. 6 is a simplified schematic view of an exhaust system 500, according to aspects of the present disclosure. The exhaust system 500 includes a main exhaust pipe 510 below the semiconductor manufacturing tools positioned on the fab level. In some embodiments, a gas source 520 is a source of a gas mixture containing a light hazardous and/or toxic gas diluted down by an inert gas. In some instances, the light hazardous and/or toxic gas is less dense than air. In some embodiments, the gas source 520 is a source of a gas mixture containing less than 4% by volume of hydrogen and more than 96% of an inert gas. In some instances, the gas source 520 is a source of a gas mixture containing about 2% by volume of hydrogen and about 98% by volume of argon. Through a discharge pipe 521, the gas source 520 ventilates into the main exhaust pipe 510.

An inert gas box 540 enclose piping, valves, tools, actuators, and safety release valves carrying a hazardous gas in its pure form or in a mixture at a concentration where the hazardous gas remains hazardous. In some instances, the inert gas box 540 is a secondary containment for a gas mixture of an inert gas and hydrogen exiting from an EUV chamber after an inert gas stream blowing over the surface of a collector of an EUV lithography system. In some instances, the inert gas is argon. The inert gas box 540 ventilates through a discharge pipe 541 into the main exhaust pipe 510. A detector 570 is installed in the discharge pipe 541 to monitor the gas moving through the discharge pipe 541. In instances where the hazardous gas is hydrogen, the detector 570 is configured to detect presence of hydrogen at low ppm levels. During regular operations, no hydrogen is flowing out of the inert gas box 540 and the detector 570 should not be triggered. However, if there is a leak in the inert gas box 540, the detector 570 should detect the minute amount of leaked hydrogen and sound an alarm. Emergency procedures such as evacuation and shutdown are usually expected in this situation.

In some embodiments, the discharge pipe 541 connects to the main exhaust pipe 510 through a bottom surface 512, rather than a top surface 514. Because hydrogen is the lightest gas and tends to flow in the topmost portion of the main exhaust pipe 510, hydrogen does not back flow into the discharge pipe 541 if it is connected through the bottom surface 512. In some instances, the discharge pipe 541 includes a U-shaped portion 542. The U-shaped portion 542 allows the discharge pipe 541 coming from above to literally enter a U-turn to connect to the main exhaust pipe 510 through the bottom surface 512. If the discharge pipe 541 connects to the main exhaust pipe 510 through the top surface 514, hydrogen from the gas mixture carried by the discharge pipe 521 into the main exhaust pipe 510 may find its way upward into the discharge pipe 541 and falsely triggers the alarm, causing unnecessary and costly shutdown and evacuation. Such a false alarm tends to take place especially when the discharge pipe 521 connects to the main exhaust pipe 510 at a location more upstream than the location where the discharge pipe 541 connects to the main exhaust pipe 510.

A hydrogen ($H_2$) gas box 550 enclose piping, valves, tools, actuators, and safety release valves carrying a hydrogen in its pure form or in a mixture at a concentration greater than hydrogen's lower flammability limit. In some instances, the hydrogen gas box 550 is a secondary containment for hydrogen to be supplied into the EUV chamber to establish a hydrogen ambient. The hydrogen gas box 550 ventilates through a discharge pipe 551 into the main exhaust pipe 510. A detector 580 is installed in the discharge pipe 551 to monitor the gas moving through the discharge pipe 551. In instances where the hazardous gas is hydrogen, the detector 580 is configured to detect presence of hydrogen at low ppm levels. During regular operations, no hydrogen is flowing out of the inert gas box 550 and the detector 580 should not be triggered. However, if there is a leak in the inert gas box 550, the detector 580 should detect the minute amount of leaked hydrogen and sound an alarm. Emergency procedures such as evacuation and shutdown are usually expected in this situation.

In some embodiments, the discharge pipe 551 connects to the main exhaust pipe 510 through a bottom surface 512, rather than a top surface 514. Because hydrogen is the lightest gas and tends to flow in the topmost portion of the main exhaust pipe 510, hydrogen does not back flow into the discharge pipe 551 if it is connected through the bottom surface 512. In some instances, the discharge pipe 551 includes a U-shaped portion 552. The U-shaped portion 552 allows the discharge pipe 551 coming from above to literally enter a U-turn to connect to the main exhaust pipe 510 through the bottom surface 512. If the discharge pipe 551 connects to the main exhaust pipe 510 through the top surface 514, hydrogen from the gas mixture carried by the discharge pipe 521 into the main exhaust pipe 510 may find its way upward into the discharge pipe 551 and falsely triggers the alarm, causing unnecessary and costly shutdown and evacuation. Such a false alarm tends to take place especially when the discharge pipe 521 connects to the main exhaust pipe 510 at a location more upstream than the location where the discharge pipe 551 connects to the main exhaust pipe 510.

Thus, the present disclosure provides an exhaust system for discharging from semiconductor manufacturing equipment a hazardous gas. The exhaust system includes: a main exhaust pipe having a top surface and a bottom surface; a first branch pipe including an upstream end coupled to a source of a gas mixture containing the hazardous gas and a downstream end connected to the main exhaust pipe through the top surface; a second branch pipe including a downstream end connected to the main exhaust pipe through the bottom surface; and a detector configured to detect presence of the hazardous gas in the second branch pipe. The gas mixture is denser than air and the hazardous gas is less dense than air.

The present disclosure also provides an exhaust system for discharging from semiconductor manufacturing equipment a hazardous gas less dense than air. The exhaust system includes: a main exhaust pipe having a bottom surface; a first branch pipe including an upstream end coupled to a source of a gas mixture containing the hazardous gas and a downstream end connected to the main exhaust pipe; and a second branch pipe having a first portion and a second portion, the first portion including a detector for detection of presence of the hazardous gas. The entire first portion of the second branch pipe is positioned above the bottom surface of the main exhaust pipe and the second portion of the second branch pipe is connected to the main exhaust pipe through the bottom surface.

In addition, the present disclosure provides an exhaust system for discharging from semiconductor manufacturing equipment a hazardous gas less dense than air. The exhaust system includes: a main exhaust pipe having a bottom surface; a first branch pipe including an upstream end coupled to a source of a gas mixture containing the hazardous gas and a downstream end connected to the main exhaust pipe; and a second branch pipe having a first portion and a second portion. The first portion includes a detector for detection of presence of the hazardous gas and is coupled to a gas containment and the entire first portion of the second branch pipe is positioned above the bottom surface of the main exhaust pipe. The second portion of the second branch pipe is connected to the main exhaust pipe through the bottom surface.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An exhaust system for discharging from semiconductor manufacturing equipment a hazardous gas, comprising:
a main exhaust pipe positioned above the semiconductor manufacturing equipment and having a top surface on a first side of the main exhaust pipe and a bottom surface on a second side of the main exhaust pipe;
a first branch pipe connected to a source of a gas mixture containing the hazardous gas on the second side of the main exhaust pipe and connected to the main exhaust pipe through the top surface;
a second branch pipe connected to a gas box on the second side of the main exhaust pipe and connected to the main exhaust pipe through the bottom surface; and
a detector on the second branch pipe configured to detect presence of the hazardous gas and downstream to the gas box,
wherein the first branch pipe is connected to the main exhaust pipe at a first location, the second branch pipe is connected to the main exhaust pipe at a second location, and
wherein the first location is more upstream than the second location.

2. The exhaust system of claim 1, wherein the first branch pipe includes a U-shaped portion,
wherein the U-shaped portion includes a downstream end of the first branch pipe connecting to the top surface of the main exhaust pipe.

3. The exhaust system of claim 1, wherein the gas mixture is denser than the hazardous gas.

4. The exhaust system of claim 1, wherein the hazardous gas tends to flow in a topmost portion of the main exhaust pipe and does not back flow into the second branch pipe.

5. The exhaust system of claim 1, wherein the gas box encloses a hazardous gas in its pure form or in a mixture at a concentration, wherein at the concentration the hazardous gas remains hazardous.

6. The exhaust system of claim 1, wherein the gas mixture includes the hazardous gas and an inert gas, wherein the hazardous gas has a concentration of less than about 4 vol. %.

7. The exhaust system of claim 1, wherein detection of presence of the hazardous gas in the second branch pipe indicates abnormal leakage of the hazardous gas from the gas box.

8. An exhaust system for discharging from semiconductor manufacturing equipment a hazardous gas, comprising:
- a main exhaust pipe positioned above the semiconductor manufacturing equipment and having a top surface on a first side of the main exhaust pipe and a bottom surface on a second side of the main exhaust pipe;
- a first branch pipe connected to a gas mixture containing the hazardous gas on the second side of the main exhaust pipe and connected to the main exhaust pipe through the top surface; and
- a second branch pipe connected to a gas box on the second side of the main exhaust pipe and connected to the main exhaust pipe through the top surface,
- wherein the first branch pipe is connected to the main exhaust pipe at a first location, the second branch pipe is connected to the main exhaust pipe at a second location, and
- wherein the first location is more upstream than the second location.

9. The exhaust system of claim 8, wherein the hazardous gas is denser than the gas mixture.

10. The exhaust system of claim 8, wherein the hazardous gas tends to sink to a bottom of the main exhaust pipe.

11. The exhaust system of claim 8, wherein the second branch pipe includes a U-shaped portion having a downstream end of the second branch pipe connected to the main exhaust pipe through the top surface.

12. The exhaust system of claim 8, further comprising a detector on the second branch pipe,
- wherein detection of presence of the hazardous gas by the detector indicates abnormal leakage of the hazardous gas from the gas box.

13. The exhaust system of claim 8, wherein the first branch pipe includes a U-shaped portion, the U-shaped portion including a downstream end of the first branch pipe connecting to the top surface of the main exhaust pipe.

14. An exhaust system for discharging from semiconductor manufacturing equipment a hazardous gas, comprising:
- a main exhaust pipe positioned below the semiconductor manufacturing equipment and having a top surface on a first side of the main exhaust pipe and a bottom surface on a second side of the main exhaust pipe;
- a first branch pipe connected to a source of a gas mixture containing the hazardous gas on the first side of the main exhaust pipe and connected to the main exhaust pipe through the top surface;
- a second branch pipe connected to a first gas box on the first side of the main exhaust pipe and connected to the main exhaust pipe through the bottom surface; and
- a third branch pipe connected to a second gas box on the first side of the main exhaust pipe and connected to the main exhaust pipe through the bottom surface.

15. The exhaust system of claim 14, wherein the second branch pipe includes a first U-shaped portion having a downstream end of the second branch pipe connected to the main exhaust pipe through the bottom surface, and
- wherein the third branch pipe includes a second U-shaped portion having a downstream end of the third branch pipe connected to the main exhaust pipe through the bottom surface.

16. The exhaust system of claim 14, wherein the hazardous gas is hydrogen, and
- wherein the second gas box encloses hydrogen in its pure form or in a mixture at a concentration greater than hydrogen's lower flammability limit.

17. The exhaust system of claim 14, wherein the gas mixture is denser than the hazardous gas, and
- wherein when the hazardous gas is in the main exhaust pipe, the hazardous gas floats adjacent the top surface and away from the bottom surface.

18. The exhaust system of claim 14, wherein the first branch pipe is connected to the main exhaust pipe at a first location, the second branch pipe is connected to the main exhaust pipe at a second location, and the third branch pipe is connected to the main exhaust pipe at a third location, and
- wherein the first location is more upstream than the second location and the third location.

19. The exhaust system of claim 14, wherein when the hazardous gas is in the main exhaust pipe, the hazardous gas does not back flow into the second branch pipe or the third branch pipe.

20. The exhaust system of claim 14, wherein the first gas box and the second gas box each enclose the hazardous gas at a concentration where the hazardous gas remains hazardous,
- wherein detection of presence of the hazardous gas in the second branch pipe indicates abnormal leakage of the hazardous gas from the first gas box, and
- wherein detection of presence of the hazardous gas in the third branch pipe indicates abnormal leakage of the hazardous gas from the second gas box.

* * * * *